United States Patent [19]

Aoyama

[11] Patent Number: 4,596,936
[45] Date of Patent: Jun. 24, 1986

[54] CIRCUIT FOR SHAPING DIGITAL SIGNALS IN AN INTEGRATED CIRCUIT

[75] Inventor: Keizo Aoyama, Yamato, Japan

[73] Assignee: Fujitsu Limited, Kawasaki, Japan

[21] Appl. No.: 561,968

[22] Filed: Dec. 15, 1983

[30] Foreign Application Priority Data

Dec. 22, 1982 [JP] Japan ................. 57-233376

[51] Int. Cl.$^4$ ................. H03K 5/08; H03K 5/12
[52] U.S. Cl. ................. 307/268; 307/360;
307/517; 307/555; 307/550; 307/263
[58] Field of Search ............ 307/268, 270, 360, 482, 307/517, 550, 555, 263

[56] References Cited

U.S. PATENT DOCUMENTS

| | | | |
|---|---|---|---|
| 3,631,267 | 12/1971 | Heimbigner | 307/270 |
| 3,824,408 | 7/1974 | Brunel | 307/268 |
| 3,989,955 | 11/1976 | Suzuki | 307/452 |
| 4,217,502 | 8/1980 | Suzuki et al. | 307/270 |
| 4,338,678 | 6/1982 | Akatsuka | 365/174 |
| 4,449,064 | 5/1984 | Eckert et al. | 307/270 |
| 4,491,748 | 1/1985 | Chappell et al. | 307/270 |
| 4,494,018 | 1/1985 | Clemen et al. | 307/482 |
| 4,498,021 | 2/1985 | Uya | 307/268 |

OTHER PUBLICATIONS

EP-A1-19241 (Nippon Electric Ltd.).

Primary Examiner—John S. Heyman
Attorney, Agent, or Firm—Staas & Halsey

[57] ABSTRACT

The present invention reduces rising and/or falling time delay of digital signals on poly-silicon layer wiring lines in semiconductors. Specific points of a network are fed with positive or negative voltage from a power source immediately after the initial rise and/or fall of the digital signals, and the potential at the specific point is rapidly pulled up or pulled down toward the source voltage. The pulling by the power source voltage is stopped when the potential reaches a specified value, and the pull-up or pull-down does not prevent subsequent operations. The signals reform or restore a square wave shape to the digital signals. The circuit includes a positive feedback circuit and a positive feedback cut-off circuit, each comprising an inverter and a transistor.

15 Claims, 10 Drawing Figures

CIRCUIT FOR SHAPING DIGITAL SIGNALS IN AN INTEGRATED CIRCUIT

BACKGROUND OF THE INVENTION

1. Field of the Invention

The present invention relates to electronic circuits dealing with high speed digital signals, in particular, it provides a circuit to reform or reshape distorted digital signals on transmission lines in integrated circuits (ICs) or large scale integrated (LSI) circuits.

2. Description of the Prior Art

In several recent semiconductor devices, a poly-silicon (polycrystalline silicon) layer has been used for internal wiring. For example, static RAM (Random Access Memories) word lines are usually formed from a poly-silicon layer. The poly-silicon word lines allow elimination of a double layer aluminum wiring line structure and decreases the height of bumps at the cross-over points of the word lines with bit lines which are also usually formed as an aluminum wiring layer. The height difference of the bumps at the cross-over points causes problems such as lower reliability and low yield for the manufactured devices. Furthermore, when both word lines and bit lines are fabricated of aluminum, the thermal treatment margin during the manufacturing process becomes narrow. All the above disadvantages increase device design difficulties and decrease design freedom.

In situations where wiring lines are used which do not require very low resistance, the poly-silicon wiring layer provides advantages despite its low conductivity as compared to aluminum, and this is the primary reason that poly-silicon is used for word lines in static RAMs. Further benefits, such as a simplified manufacturing process and improved yield are also provided by using poly-silicon wiring lines, since lines can be formed along with other IC elements using the normal processes for fabricating the devices.

In order to avoid the relatively high resistivity of poly-silicon wiring, it is necessary to make the wiring lines wide, however, this increases the capacitance of the lines. The large resistance and capacitance of poly-silicon lines distorts transmitted signals and increases the delay in the rise and/or fall time of the transmitted signals. As a result, the logic speed decreases and operational errors by the device increase. For example, about 60 to 70 nanoseconds of delay is inevitable in the signals on poly-silicon word lines for a prior art state-of-the-art 64 K bit static RAM.

FIG. 1A is a schematic diagram of a prior art poly-silicon wiring line, and FIG. 1B is a graph of signal waveforms at the points "a" and "b" in FIG. 1A. In FIGS. 1A and 1B, a square wave digital signal (curve a) is supplied to an input end "a" of a network from a signal source(S) 101, a word line driver, for example. The signal is distorted (as shown by curve b) while passing along a long wiring line, such as a poly-silicon word line in a static RAM, for example. The poly-silicon wiring line can be considered as a distributed equivalent constant circuit consisting of a resistance 102 and a capacitance 103. The resistance 102 is inherent in the poly-silicon wiring line, while the capacitance 103 represents the total capacitance of the line including the capacitance of the components attached to the poly-silicon wiring line and the capacitance between the substrate of the IC and the wiring line, etc.

Recent ICs or LSIs require a delay time on the order of 10 nanoseconds or less and, as the integration density gets higher, the wiring lines become finer and longer. These problems make poly-silicon wiring layers difficult to use in these applications. One approach in solving the delay problem is to provide a poly-silicon layer having a lower resistivity. With this approach, an improvement of only a fifty percent reduction in terms of the delay time has been achieved. Another approach is to provide circuitry which cuts off the tail of the delayed signals using a gate attached at the end of each wiring line. This approach cannot improve rise time, is ineffective for longer wiring lines and has the drawback of requiring clock measurements. Consequently, a breakthrough in poly-silicon layer wiring is needed to overcome the delay time problems associated with increased integration of ICs and LSIs.

SUMMARY OF THE INVENTION

It is an object of the present invention to reduce delay time of distorted digital signals in large or long circuit networks.

It is another object of the present invention to facilitate high speed operation of highly integrated semiconductor networks.

It is an additional object of the present invention to reduce operational errors in highly integrated semiconductor networks.

It is yet another object of the present invention to facilitate increased integration density of ICs or LSIs.

It is also an object of the present invention to provide a signal distortion correction circuit that can be connected at any point on an IC or LSI signal line.

It is a further object of the present invention to provide long, narrow signal lines in ICs and LSIs in which signal distortion is corrected.

It is still a further object of the present invention to decrease the rise time and fall time of transmitted signals on IC or LSI transmission lines.

These objects can be accomplished by attaching a circuit for reforming or reshaping distorted digital signals to points in semiconductor networks. The circuit of the present invention incorporates two essential functions: (1) feeding a specific point of a network with the potential from a power source when the initial rise and fall of the input signal is detected; and (2) stopping the above-mentioned feeding of the potential when completion of the rise and fall of the input signals is detected. In this way, the rising and falling portions (leading and trailing edges) of the distorted digital signals are reformed. This shaping is provided by a leading edge sensing circuit and a circuit for boosting the leading edge of the input signal; and by a trailing edge sensing circuit and a circuit for pulling down the trailing edge of the input signal.

These together with other objects and advantages, which will be subsequently apparent, reside in the details of construction and operation as more fully hereinafter described and claimed, reference being had to the accompanying drawings forming a part hereof, wherein like numerals refer to like parts throughout.

DESCRIPTION OF THE PREFERRED EMBODIMENTS

Figure 1A:
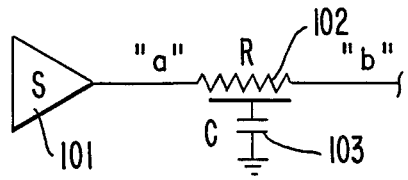
FIG. 1A is a schematic diagram of a prior art poly-silicon wiring line.
Figure 1B:
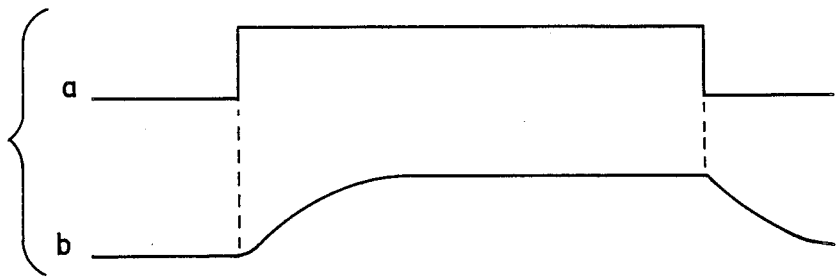
FIG. 1B is a graph of signal waveforms at the points "a" and "b" in FIG. 1A.
Figure 2:
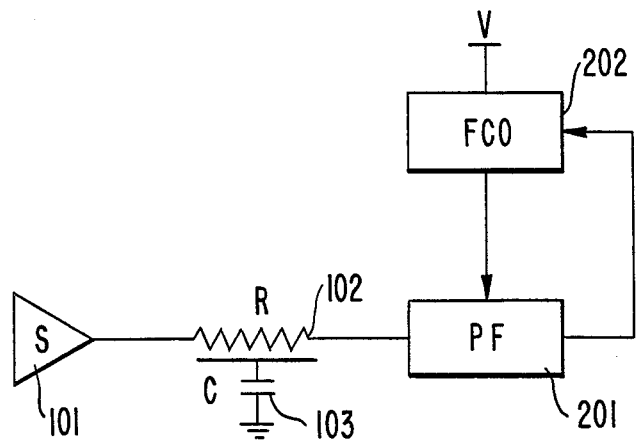
FIG. 2 is a block diagram illustrating the operating principle of the present invention.

FIG. 2 is a conceptual block diagram for explaining the operating principles of the present invention. A positive feedback circuit (PF) 201 detects the initial rise and/or fall of the digital input signals at the point "b" and feeds the point "b" from power source voltage V. A positive feedback cut-off circuit (FCO) 202 detects the completion of the rise and/or fall of the digital signals and cuts off the positive feedback.

Figure 3A:
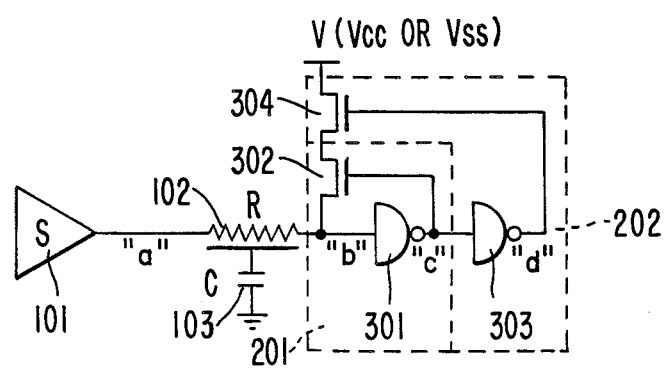
FIG. 3A is a circuit diagram of a positive feedback circuit and a positive feedback cut-off circuit according to the present invention.

FIG. 3A is a circuit diagram of a generalized embodiment of the present invention comprising the positive feedback circuit 201 and the positive feedback cut-off circuit 202. The positive feed-back circuit 201 comprises a first inverter 301 and a first MOS transistor 302, and the cut-off circuit 202 is connected in series with the feedback circuit 201 and comprises a second inverter 303 and a second MOS transistor 304. The first and second MOS transistors 302 and 304 are both p-channel type or n-channel type transistors depending on whether the purpose of the circuit is to reform the rising edge portion or falling edge portion of the digital signals. MOS transistors are referred to herein for the purpose of explaining the circuit of the present invention and, as recognized by those skilled in the art, the transistors can be MIS (Metal-Insulator-Semiconductor) transistors or other type transistors.

A first embodiment of the present invention is directed to reforming the rising edge portion of the signals and p-channel type MOS transistors are used as the first MOS transistor 302 and the second MOS transistor 304, and the source of the second MOS transistor 304 is supplied with a positive voltage $V_{cc}$.

Figure 3B:
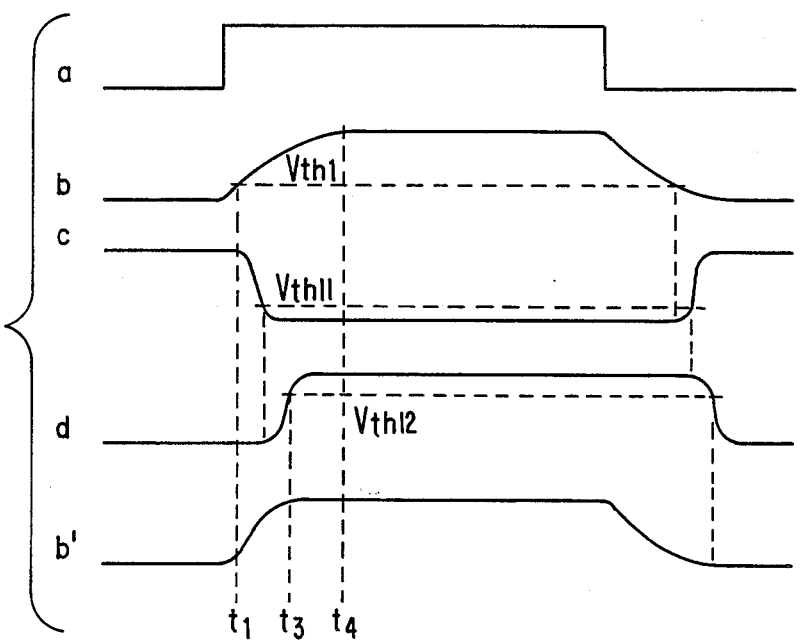
FIG. 3B is a graph of signal waveforms observed at points "a", "b", "c" and "d" in FIG. 3A when MOS (Metal Oxide Semiconductor) transistors 302 and 304 of FIG. 3A are a p-channel type.

Referring now to FIGS. 3A and 3B, when a distorted signal (curve b), FIG. 3B, is input to the first inverter 301, the output of the first inverter 301 (curve c) changes to a low level immediately after the input signal exceeds $V_{th}1$, the threshold level of the first inverter 301. The low level signal from the first inverter 301 causes the first MOS transistor 302 to turn ON. At this time, the second MOS transistor 304 is still ON, because there is a short delay until the second inverter 303 switches its output to a high level. At this time, both MOS transistors 302 and 304 are ON, and the potential at the point "b", in FIG. 3A, is rapidly pulled up toward potential of power source voltage $V_{cc}$. When the output of the first inverter 301 reaches the threshold level $V_{th}11$, the threshold level of the second inverter 303, the output voltage of the second inverter 303 (curve d) changes to the high level. The second MOS transistor 304 turns OFF as soon as the output of the second inverter 303 reaches the level $V_{th12}$, then the point "b" is cut off from the power source $V_{cc}$, and the point "b" retains the voltage $V_{cc}$. The level $V_{th12}$ is determined in accordance with $V_{th12} = V_{cc} - V_{th(304)}$, where $V_{cc}$ is the power source voltage, and $V_{th(304)}$ is the cut-off voltage of the second MOS transistor 304.

In the manner described above, the potential at the point "b" is rapidly pulled up to a level almost equal to the power source voltage $V_{cc}$ which is equal to the high level of the original digital signal output by the word line driver 101. This pull-up is performed in a short period of time from $t_1$ to $t_3$, as illustrated in FIG. 3B. The rise time is reduced from the time interval $t_4$-$t_1$ to the time interval $t_3$-$t_1$, and the distorted signal, as shown by the curve b in FIG. 3B, is reformed as the curve b' in FIG. 3B. Since the point "b" in the circuit is cut off from the power source $V_{cc}$ after the potential reaches $V_{cc}$, the subsequent slow potential fall at point "b" is not prevented.

During the falling portion of the input digital signal, the first MOS transistor 302 turns OFF when the first inverter 301 detects that the level of the digital signal is lower than threshold level $V_{th1}$. Accordingly, the point "b" in the circuit is kept cut off from the power source voltage $V_{cc}$, even when the second MOS transistor 304 is turned ON by the low level output of the second inverter 303. The circuit illustrated in FIG. 3A, therefore, does not operate at the falling edge of the digital signal and the reforming of the tail portion of the signal is still insufficient.

Figure 3C:
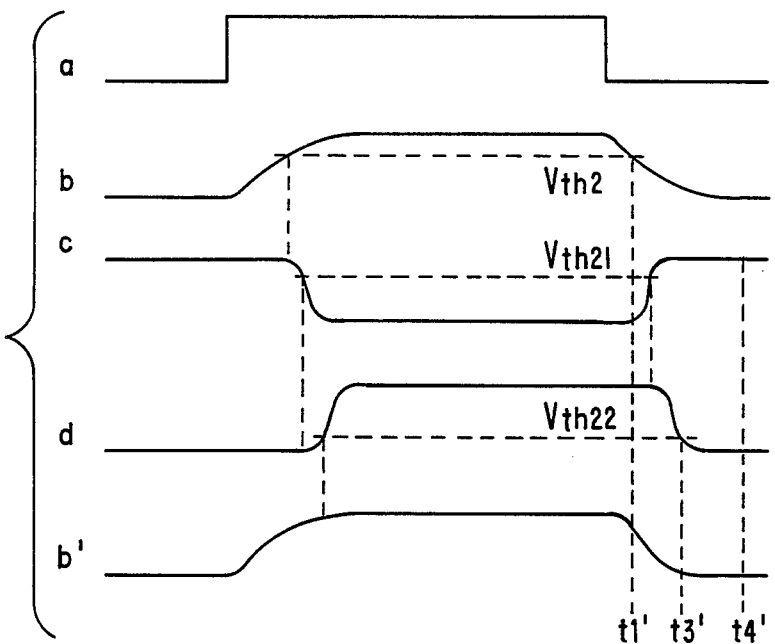
FIG. 3C is a graph of signal waveforms observed at the points "a", "b", "c" and "d" in FIG. 3A when MOS transistors 302 and 304 are an n-channel type.

A second embodiment, as shown in FIG. 3C, is directed to reforming the falling edge portion of the digital input signals. The first MOS transistor 302 and the second MOS transistor 304 are selected as n-channel type transistors, the source of the second MOS transistor 304 is supplied with a negative voltage $V_{ss}$, and the first inverter 301 and the second inverter 303 are adjusted to have threshold levels $V_{th2}$ and $V_{th21}$, respectively. As shown in FIG. 3C, both levels are different from those of the first embodiment as illustrated in FIG. 3B.

Referring to FIGS. 3A and 3C, the output of the first inverter 301 (curve c) changes to a high level immediately after the signal at the point "b" falls to the threshold level $V_{th2}$, then the first MOS transistor 302, being an n-channel type, turns ON. At this time, the second MOS transistor 304, being an n-channel type, is still ON because the output level of the first inverter 301 is not high enough to reach $V_{th21}$, the threshold level of the second inverter 303. Thus, both MOS transistors 302 and 304 are ON, and the potential at the point "b" is rapidly pulled down toward the potential of the power source voltage $V_{ss}$. When the output level of the first inverter 301 reaches the threshold level $V_{th21}$, the output level of the second inverter 303 (curve d) changes to a low level. The second MOS transistor 304 turns OFF as soon as the output level of the second inverter 303 reaches the threshold level $V_{th22}$. As a result, the point "b" is cut off from the power source, and stops being pulled down to the voltage level $V_{ss}$. The level $V_{th22}$ is determined in accordance with $V_{th22} = V_{th'(304)}$, where $V_{th'(304)}$ is cut-off voltage of the n-channel type MOS transistor 304.

In the manner described above, the potential at the point "b" is pulled down to a level almost equal to the level of the power source voltage $V_{ss}$, in a short period of time from $t_1'$ to $t_3'$ in FIG. 3C. The fall time is reduced from $t_4'-t_1'$ to $t_3'-t_1'$, and the distorted signal of curve b is reformed as the curve b' in FIG. 3C.

In substantially the same manner as described before, the reforming or shaping function does not operate during the rising edge of the digital signal in this second embodiment.

Figure 4:
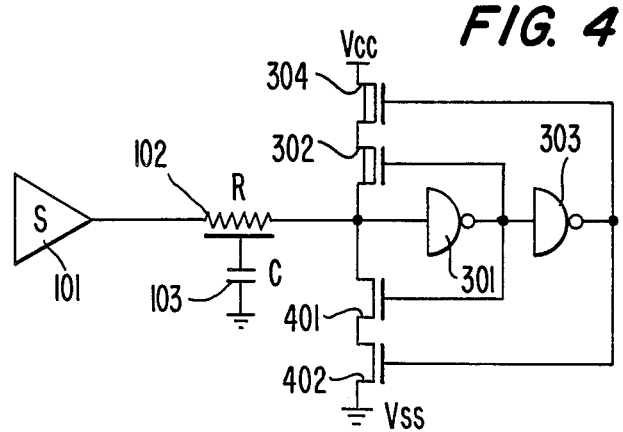
FIG. 4 is another embodiment of the present invention.

A third embodiment of the present invention is directed to reforming both the rising and falling edge portions of the digital signals. Referring to FIG. 4, first and second MOS transistors 302 and 304 are p-channel type transistors and third and fourth MOS transistors 401 and 402 are n-channel type transistors. These transistors are respectively connected in series, and the source of the second MOS transistor 304 is supplied with a positive voltage $V_{cc}$ from the power source, and the source of the fourth MOS transistor 402 is supplied with a negative voltage $V_{ss}$ from the power source. $V_{cc}$ is equal to the high level and $V_{ss}$ is equal to the low level of the original input digital signal output by the word line driver 101. The MOS transistors 302 and 304 operate to reform the rising edge portion of the signal in the same manner as described in the first embodiment and the MOS transistors 401 and 402 operate to reform the falling edge portion of the signal in the same manner as described in the second embodiment.

In this embodiment, the timing for starting the reforming of the rising edge portion and that for reforming the falling edge portion of the signal cannot be selected independently of each other, because the same control voltage is applied to each of the transistors 302 and 401. The lower $V_{th1}$ (threshold of inverter 301) is effective for reducing rising time delay, but results in a poor improvement in falling time delay. In contrast, a higher $V_{th1}$ is effective in reducing the falling time delay, but spoils the improvement in the rising time delay. Therefore, it is preferable to set $V_{th1}=V_{th2}$ at a middle potential value between the high and low levels of the input signal and then both delay times are improved to the same degree.

Figure 5A:
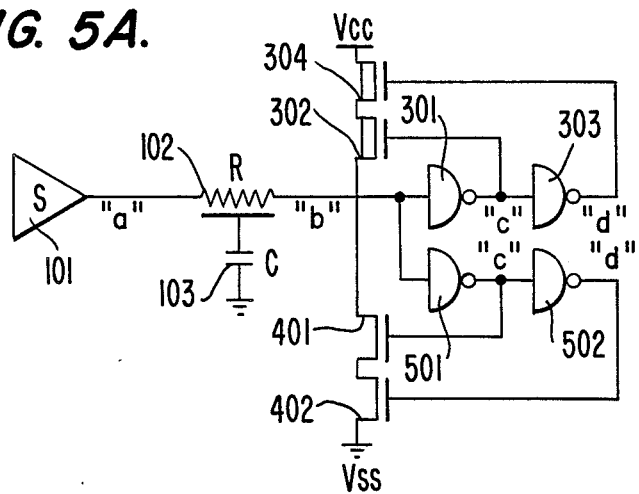
FIG. 5A is a further embodiment of the present invention.
Figure 5B:
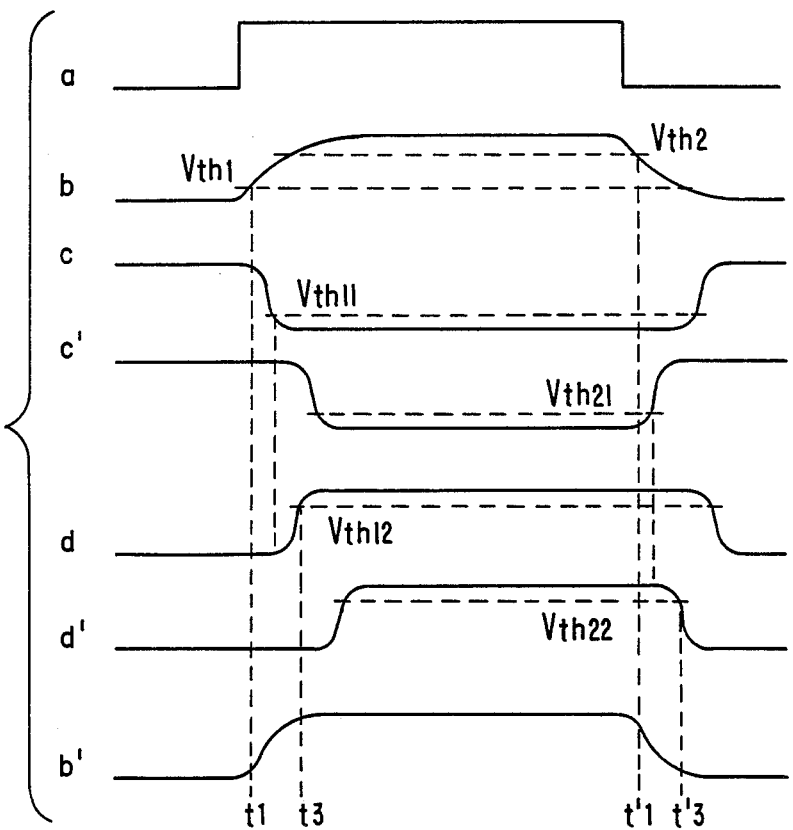
FIG. 5B is a graph of signal waveforms observed at points "a", "b", "c", "c'", "d" and "d'" in FIG. 5A.

A fourth embodiment of the present invention is directed to allowing independent timing selection in reforming both the rising edge portion and falling edge portions of the input signal, that is, the rising time delay and the falling time delay are reduced individually to be as small as possible. This embodiment is shown in FIGS. 5A and FIG. 5B. Comparing the circuit of FIG. 5A to that of FIG. 4, it will be seen that additional inverters 501 and 502 are included. The first MOS transistor 302, the second MOS transistor 304, the first inverter 301 and the second inverter 303 work similar to those of FIG. 3A to reform the rising edge portion of the input signal, and third MOS transistor 401 and fourth MOS transistor 402 work to improve the falling edge portion of the input signal. Threshold levels $V_{th1}$ and $V_{th2}$, and also $V_{th11}$ and $V_{th21}$ in FIG. 5B can be different from each other. This allows the timing for starting the reforming to be selected independently for the rising edge portion as well as the falling edge portion, and a more precise delay time improvement is possible. In FIG. 5B, the curves a, b, and b' are the same as in the preceding embodiments and curves c, c', d, and d' show the changes of levels at the points marked by "c", "c'", "d" and "d'", respectively.

In the manner as described previously, the potential at the point "b" is pulled up to a level almost equal to the level of the source voltage $V_{cc}$ during a time period from t1 to t3 in FIG. 5B. The potential at point "b" is pulled down to a level almost equal to the level of the source voltage $V_{ss}$ during a period from $t_1'$ to $t_3'$. $V_{cc}$ and $V_{ss}$ are equal to the high level and the low levels of the original digital signal, respectively, and the distorted signal shown by the curve b is reformed as the curve b', illustrated in FIG. 5B.

Figure 6:
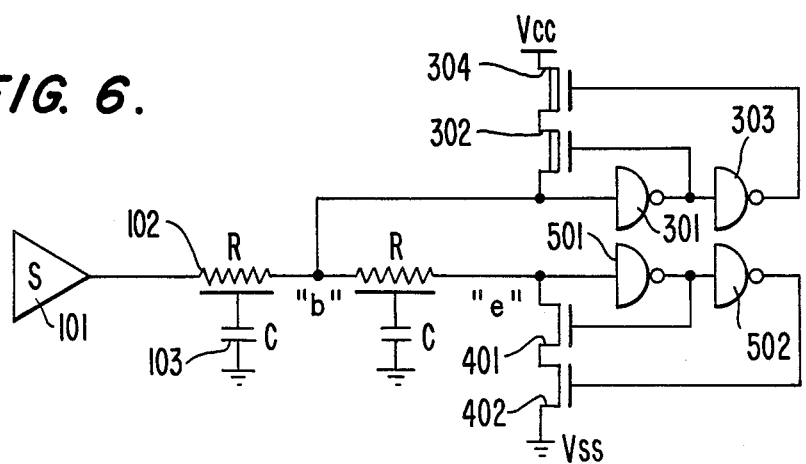
FIG. 6 is still another embodiment of the present invention.

A fifth embodiment of the present invention is directed to allowing independent timing selection for reforming both the rising edge portion of the input signal as in the fourth embodiment, but differs from the fourth embodiment in that the reforming for the rising edge portion and the falling edge portion of the signal are initiated at different points on the signal line, that is, the pull-up or pull-down of the line potential is conducted at different points on the poly-silicon line. Referring to FIG. 6, the first MOS transistor 302 and the second MOS transistor 304 are p-channel type transistors, and the source of the second MOS transistor 304 is supplied with a positive voltage $V_{cc}$, while the third MOS transistor 401 and the fourth MOS transistor 402 are n-channel type transistors, and the source of the fourth MOS transistor 402 is supplied with a negative voltage $V_{ss}$. The first inverter 301 and the drain of the first MOS transistor 302 are connected to the point marked by "b", while the third inverter 401 and the drain of the third MOS transistor 401 are connected to the point marked by "e". The potential at the point "b" is pulled up toward source voltage $V_{cc}$ during the rising sequence of the signal, and the potential at the point "e" is pulled down toward source voltage $V_{ss}$ during the falling sequence of the signal. It is obvious that each of the points "b" and "e" is subject to a relatively weak pull-down or pull-up effect produced by potential change caused by the counterpart circuit. This weak pull-down or pull-up effect also contributes to delay time reduction more or less. This embodiment increases the freedom of the physical design of the circuit network because the need for concentrating the reforming circuit elements in a specified area is eliminated. Suitable delay time control can also be performed, according to short time rise or short fall time requirements, which differ from point to point in the network.

In the circuit of the present invention, rise and/or fall time of reformed signals are altered by each inverter and MOS transistor comprising the circuit and the shaping ultimately depends on the speed of the inverters and MOS transistors. With this invention, a delay time of approximatey 10 nanoseconds is achieved on a poly-silicon wiring line whose RC time contant is equivalent to that of word lines in the state-of-the-art 64 K bit static RAMs, which, in the prior art, had a delay time of approximately 70 nanoseconds.

Any number of the circuits of the present invention may be dispersed and attached to various points in the wiring lines of large scale semiconductor networks to reform the digital signals. The networks can then ignore the limitations on using poly-silicon wiring lines and achieve increased integration density. As the result of the achievement in reducing the delay time of signals on poly-silicon layer wiring line, the present invention may facilitate an increase in the operation speed of highly integrated semiconductor networks, facilitates an increase in the integration densities of ICs or LSIs, and reduces operational errors in highly integrated semiconductor networks. Thus, the present invention provides a breakthrough in overcoming the disadvantages inherent in a poly-silicon wiring layer. This means that the present invention may greatly extend the application of poly-silicon wiring layers.

The many features and advantages of the present invention are apparent from the detailed specification and, thus, it is intended by the appended claims to cover all such features and advantages of the device which fall within the true spirit and scope of the invention. Further, since numerous modifications and changes will readily occur to those skilled in the art, it is not desired to limit the invention to the exact construction and operation illustrated and described, and, accordingly, all suitable modifications and equivalents may be resorted to, falling within the scope of the invention. For example, the present invention can be applied to wiring lines fabricated other than with a poly-silicon layer, including such compound semiconductor layers as gallium arsenide (GaAs) layers. It is also understood by those skilled in the art that any one of the above embodiments may be applied to specific points of any wiring line in a semiconductor circuit network, and the MOS transistors may be interpreted more broadly as MIS (Metal Insulator Semiconductor) transistors.

I claim:

1. A circuit to reform digital signals on a signal line in an integrated circuit, comprising:

boosting means, operatively connected to the signal line, for detecting the initial rise and/or fall of the digital signals and applying a potential from a power source to the signal line, said boosting means comprising:

a first inverter, operatively connected to the signal line, for receiving the digital signals and having an output terminal; and a first MIS (Metal-Insulator-Semiconductor) transistor having a gate operatively connected to the output terminal of said first inverter and a drain operatively connected to the signal output line; and cut-off means, operatively connected to the signal line and said boosting means, for detecting the completion of the rise and/or fall of the digital signals and stopping the application of the potential to the signal line, said cut-off means comprising:

a second inverter operatively connected to the output terminal of said first inverter and having an output terminal; and a second MIS transistor having a gate operatively connected to the output terminal of said second inverter and a source connected to the power source, said first and second MIS transistors operatively connected in series between the signal line and the power source.

2. A circuit as recited in claim 1, wherein said first and second MIS transistors comprise p-channel type field effect transistors (FETs) and the source of said second MIS transistor is connected to a positive voltage of the power source.

3. A circuit as recited in claim 1, wherein said first and second MIS transistors comprise n-channel type FETs and the source of said second MOS transistor is connected to a negative voltage of the power source.

4. A circuit as recited in claim 2, further comprising:
   a third MIS transistor of an n-channel type having a source, a gate operatively connected to the output terminal of said first inverter and a drain operatively connected to the signal line; and a fourth MIS transistor of an n-channel type having a gate operatively connected to the output terminal of said second inverter, a drain operatively connected to the source of said third MIS transistor and a source operatively connected to a negative voltage of the power source.

5. A circuit as recited in claim 2, further comprising:
   third and fourth n-channel MIS transistors operatively connected in series between the signal line and a negative voltage of the power source, and each having a gate and a source of said fourth MIS transistor operatively connected to the negative voltage of the power source;

a third inverter operatively connected to the signal line and having an output terminal operatively connected to the gate of the third MIS transistor; and a fourth inverter operatively connected to the output terminal of said third inverter and to the gate of said fourth MIS transistor.

6. A circuit as recited in claim 2, wherein said first MIS transistor is operatively connected to the signal line at a first point and said circuit further comprises:
   third and fourth n-channel MIS transistors operatively connected in series between a second point on said signal line separate from the first point and a negative voltage of the power source, each having a gate and said fourth MIS transistor having a source operatively connected to the negative voltage of the power source;

a third inverter operatively connected to the second point and having an output terminal operatively connected to the gate of said third MIS transistor; and a fourth inverter operatively connected to the output terminal of said third inverter and the gate of said fourth MIS transistor.

7. A digital signal shaping circuit for a signal line in an integrated circuit, comprising:
   sensing means, operatively connected to the signal line, for sensing the digital signal on the signal line, said sensing means comprising a pair of inverters including:
   a first inverter connected to the signal line;
   a second inverter connected to said first inverter;

shaping means, operatively connected to said pair of inverters and said signal line, for boosting a rising edge portion of the digital signal or pulling down a trailing edge portion of the digital signal, said shaping means comprising a pair of transistors including:
   a first transistor connected to the signal line and said first inverter; and
   a second transistor connected to said second inverter and said first transistor; and said first inverter having a first threshold value and producing a first level signal when the digital signal is greater than or equal to the first threshold value causing said first transistor to turn on, said second inverter having a second threshold value and producing a second level signal when the output of said first inverter is less than or euqal to the second threshold value, and said second transistor having a third threshold value and when the output of said second inverter is greater than or equal to said third threshold value, said second transistor turning off.

8. A digital signal shaping circuit for a signal line in an integrated circuit, comprising:
sensing means, operatively connected to the signal line, for sensing the digital signal on the signal line, said sensing means comprising a pair of inverters including:
a first inverter connected to the signal line; and
a second inverter connected to said first inverter;
shaping means, operatively connected to said pair of inverters and said signal line, for boosting a rising edge portion of the digital signal or pulling down a trailing edge portion of the digital signal, said shaping means comprising a pair of transistors including:
a first transistor connected to the signal line and said first inverter; and
a second transistor connected to said second inverter and said first transistor; and
said first inverter having a first threshold value and producing a first level signal when the digital signal is less than or equal to the first threshold value causing said first transistor to turn on, said second inverter having a second threshold value and producing a second level signal when the output of said first inverter is greater than or equal to the second threshold vaue, and said second transistor having a third threshold value and when the output of said second inverter is less than or equal to said third threshold value, said second transistor turning off.

9. A digital signal shaping circuit for a signal line in an integrated circuit, comprising:
sensing means, operatively connected to the signal line, for sensing the digital signal on the signal line, said sensing means comprising a pair of inverters including:
a first inverter connected to the signal line; and
a second inverter connected to said first inverter; and
shaping means, operatively connected to said pair of inverters and said signal line, for boosting a rising edge portion of the digital signal or pulling down a trailing edge portion of the digital signal, said shaping means comprising:
a first transistor connected to the signal line and said first inverter;
a second transistor connected to said second inverter, said first transistor and a positive power supply;
a third transistor connected to the signal line and said first inverter; and
a fourth transistor connected to said second inverter, said third transistor and a negative power supply.

10. A circuit as recited in claim 9, wherein said first and second transistors are p-channel transistors and said third and fourth transistors are n-channel transistors.

11. A digital signal shaping circuit for a signal line in an integrated circuit, comprising:
sensing means, operatively connected to the signal line, for sensing the digital signal on the signal line, said sensing means comprising a pair of inverters including:
a first inverter connected to the signal line; and
a second inverter connected to said first inverter;
shaping means, operatively connected to said pair of inverters and said signal line, for boosting a rising edge portion of the digital signal or pulling down a trailing edge portion of the digital signal, said shaping means comprising:
a first transistor connected to the signal line and said first inverter; and
a second transistor connected to said second inverter, said first transistor and a positive power supply;
a third inverter connected to the signal line;
a fourth inverter connected to said third inverter;
a third transistor connected to the signal line and said third inverter; and
a fourth transistor connected to said fourth inverter, said third transistor and a negative power supply.

12. A circuit as recited in claim 11, wherein said first inverter has a first threshold value and produces a first level signal when the digital signal is greater than or equal to the first threshold value causing said first transistor to turn on, said second inverter has a second threshold value and produces a second level signal when the output of said first inverter is less than or equal to the second threshold value, said second transistor has a third threshold value and when the output of said second inverter is greater than or equal to said third threshold value, said second transistor turns off, said third inverter has a fourth threshold value and produces the second level signal when the digital signal is less than or equal to the fourth threshold value causing said third transistor to turn on, said fourth inverter has a fifth threshold value and produces the first level signal when the output of said third inverter is greater than or equal to the fifth threshold value, and said fourth transistor has a sixth threshold value and when the output of said fourth inverter is less than or equal to the sixth threshold value, the fourth transistor turns off.

13. A circuit as recited in claim 11, wherein said first inverter, said third inverter, said first transistor and said third transistor are connected to the same point on the signal line.

14. A circuit as recited in claim 11, wherein said first inverter and said first transistor are connected to the signal line at a different point than said third inverter and said third transistor.

15. A circuit as recited in claim 11, wherein said first and second transistors are p-channel transistors and said third and fourth transistors are n-channel transistors.

* * * * *